(12) United States Patent
Iwata et al.

(10) Patent No.: US 9,484,180 B2
(45) Date of Patent: Nov. 1, 2016

(54) PLASMA PROCESSING METHOD AND PLASMA PROCESSING APPARATUS

(71) Applicant: Tokyo Electron Limited, Tokyo (JP)

(72) Inventors: Manabu Iwata, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 26 days.

(21) Appl. No.: 14/475,905

(22) Filed: Sep. 3, 2014

(65) Prior Publication Data

US 2015/0069910 A1 Mar. 12, 2015

(30) Foreign Application Priority Data

Sep. 6, 2013 (JP) ................................. 2013-185326

(51) Int. Cl.
*H01J 37/32* (2006.01)
*H01J 37/02* (2006.01)

(52) U.S. Cl.
CPC ........ *H01J 37/026* (2013.01); *H01J 37/32091* (2013.01); *H01J 37/32697* (2013.01)

(58) Field of Classification Search
USPC ........................................ 315/111.21–111.91
See application file for complete search history.

(56) References Cited

U.S. PATENT DOCUMENTS

| 7,907,384 | B2* | 3/2011 | Brown | H01L 21/6831 361/230 |
|---|---|---|---|---|
| 7,951,262 | B2* | 5/2011 | Koshiishi | H01J 37/32082 156/345.44 |
| 8,137,471 | B2* | 3/2012 | Koshiishi | H01J 37/32082 118/715 |
| 8,303,834 | B2* | 11/2012 | Honda | H01J 37/32091 216/58 |
| 8,317,969 | B2* | 11/2012 | Iwata | H01J 37/32091 118/723 E |
| 8,738,314 | B2* | 5/2014 | Tanaka | G01R 27/28 324/76.39 |
| 8,790,490 | B2* | 7/2014 | Koshiishi | H01J 37/32082 118/723 R |
| 8,854,790 | B1* | 10/2014 | Hsieh | H01L 21/68735 361/234 |
| 9,171,700 | B2* | 10/2015 | Gilmore | H01J 37/32183 |
| 2006/0037703 | A1* | 2/2006 | Koshiishi | H01J 37/32082 156/345.47 |
| 2007/0236148 | A1* | 10/2007 | Yamazawa | H01J 37/321 315/111.21 |
| 2008/0237819 | A1* | 10/2008 | Wieland | H01L 21/6833 257/676 |
| 2009/0242133 | A1* | 10/2009 | Nakayama | H01J 37/32091 156/345.44 |
| 2009/0242134 | A1* | 10/2009 | Iwata | H01J 37/32568 156/345.48 |
| 2009/0242515 | A1* | 10/2009 | Honda | H01J 37/32091 216/67 |
| 2010/0000970 | A1* | 1/2010 | Koshimizu | H01J 37/32522 216/67 |
| 2010/0126668 | A1* | 5/2010 | Koshiishi | H01J 37/32082 156/345.47 |

(Continued)

FOREIGN PATENT DOCUMENTS

WO 03/009363 A1 1/2003

*Primary Examiner* — Douglas W Owens
*Assistant Examiner* — Srinivas Sathiraju
(74) *Attorney, Agent, or Firm* — Pearne & Gordon LLP

(57) ABSTRACT

A plasma processing apparatus includes a processing chamber; a conductive base within the processing chamber; an electrostatic chuck, having an electrode, provided on the base; a high frequency power supply that applies a high frequency power to the base; a first DC power supply that applies a DC voltage to the electrostatic chuck; and a plasma generation unit that generates plasma of a processing gas within the processing chamber. A plasma processing method performed in the plasma processing apparatus includes connecting the first DC power supply to the electrode of the electrostatic chuck; cutting off connection between the first DC power supply and the electrode of the electrostatic chuck; and generating the plasma within the processing chamber by applying the high frequency power to the base in a state that the connection between the first DC power supply and the electrode of the electrostatic chuck is cut off.

8 Claims, 5 Drawing Sheets

(56) References Cited

U.S. PATENT DOCUMENTS

| | | | | |
|---|---|---|---|---|
| 2010/0176086 A1* | 7/2010 | Iwata | ................ | H01J 37/32091 216/71 |
| 2011/0048453 A1* | 3/2011 | Honda | ................ | C23C 16/4405 134/1.1 |
| 2012/0084037 A1* | 4/2012 | Tanaka | ................ | G01R 27/28 702/85 |
| 2012/0098614 A1* | 4/2012 | Boston | ................ | H03H 7/40 333/17.3 |
| 2012/0145324 A1* | 6/2012 | Koshiishi | ................ | H01J 37/32082 156/345.29 |
| 2012/0217221 A1* | 8/2012 | Hoffman | ................ | C23C 14/345 216/61 |
| 2012/0319584 A1* | 12/2012 | Brouk | ................ | H01J 37/32009 315/111.21 |
| 2013/0199727 A1* | 8/2013 | Iwata | ................ | H05H 1/46 156/345.28 |
| 2014/0061156 A1* | 3/2014 | Brouk | ................ | H01J 37/32091 216/61 |
| 2014/0062303 A1* | 3/2014 | Hoffman | ................ | H05H 1/46 315/111.21 |
| 2014/0124139 A1* | 5/2014 | Koshiishi | ................ | H01J 37/32091 156/345.28 |
| 2014/0326409 A1* | 11/2014 | Koshiishi | ................ | H01J 37/32082 156/345.29 |
| 2015/0069910 A1* | 3/2015 | Iwata | ................ | H01J 37/32091 315/111.21 |

* cited by examiner

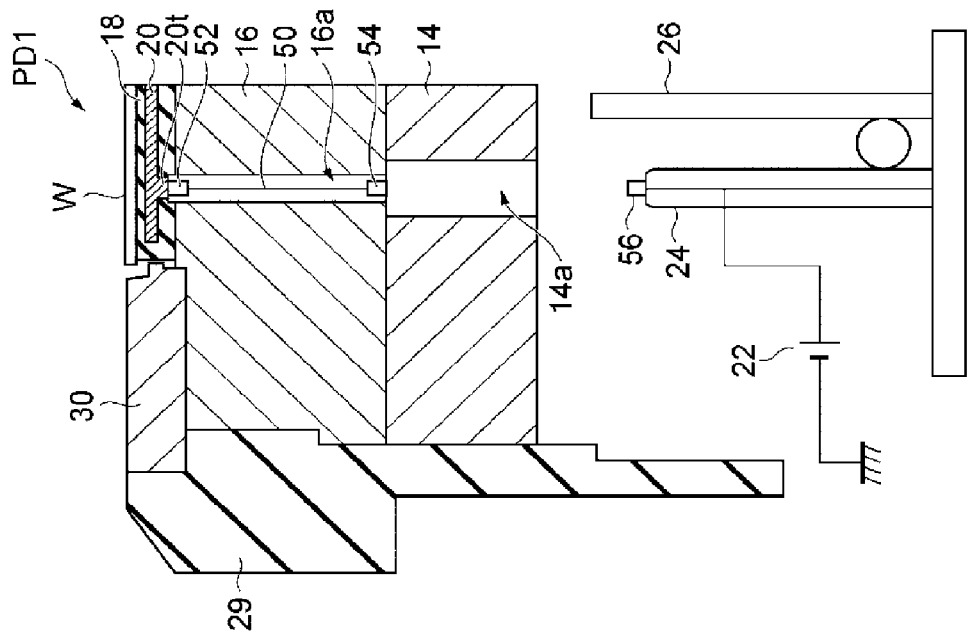
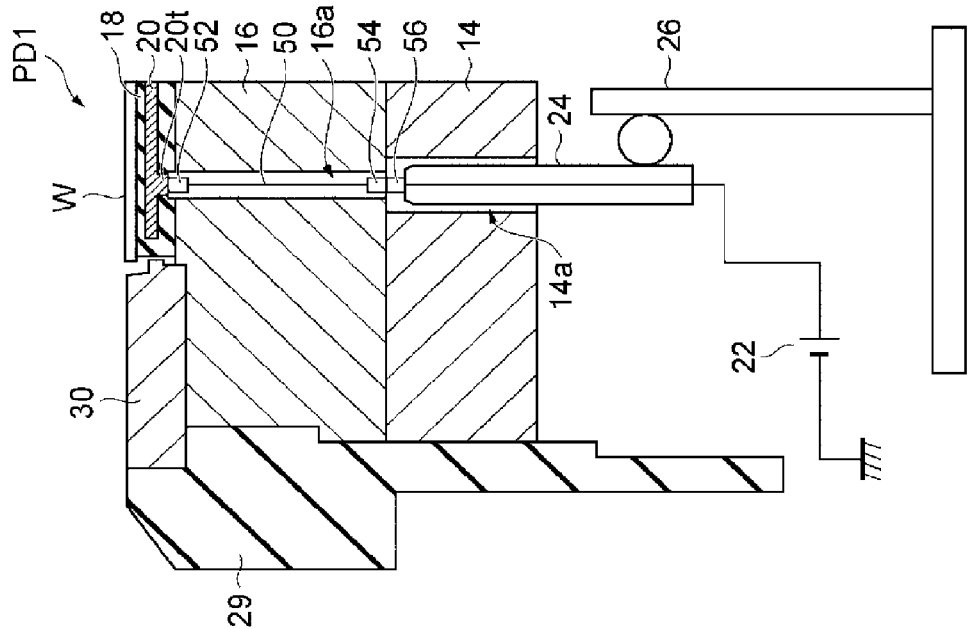

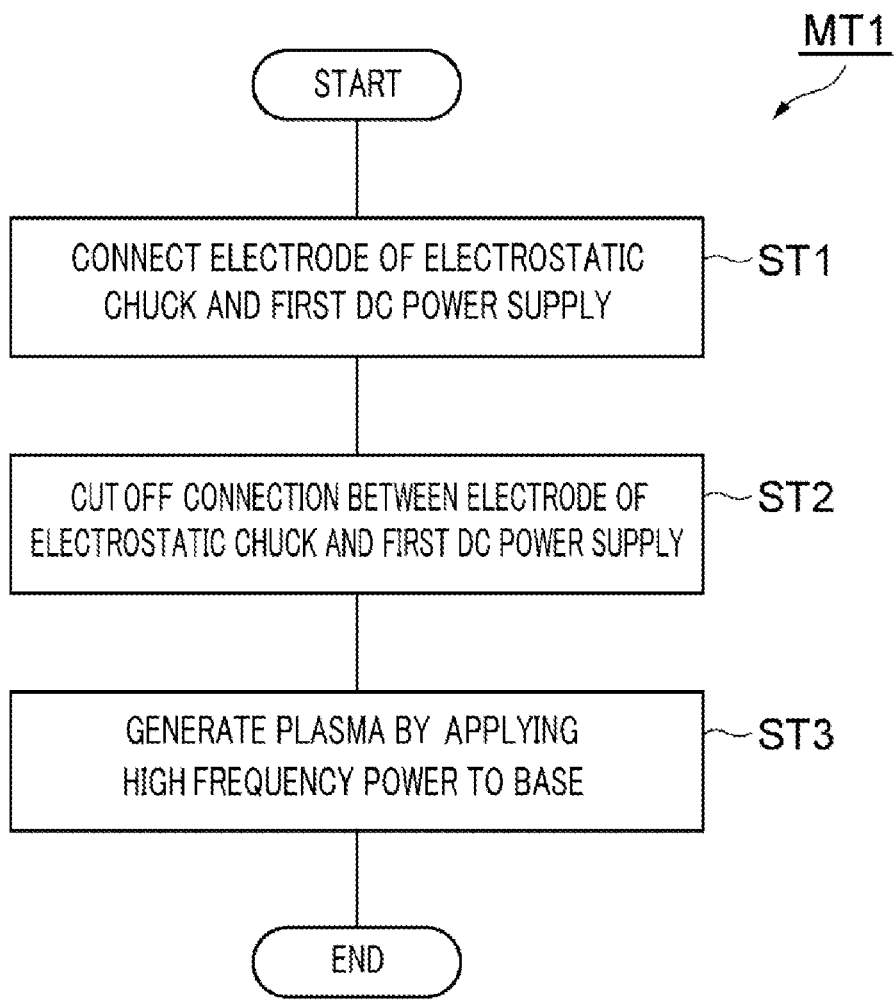

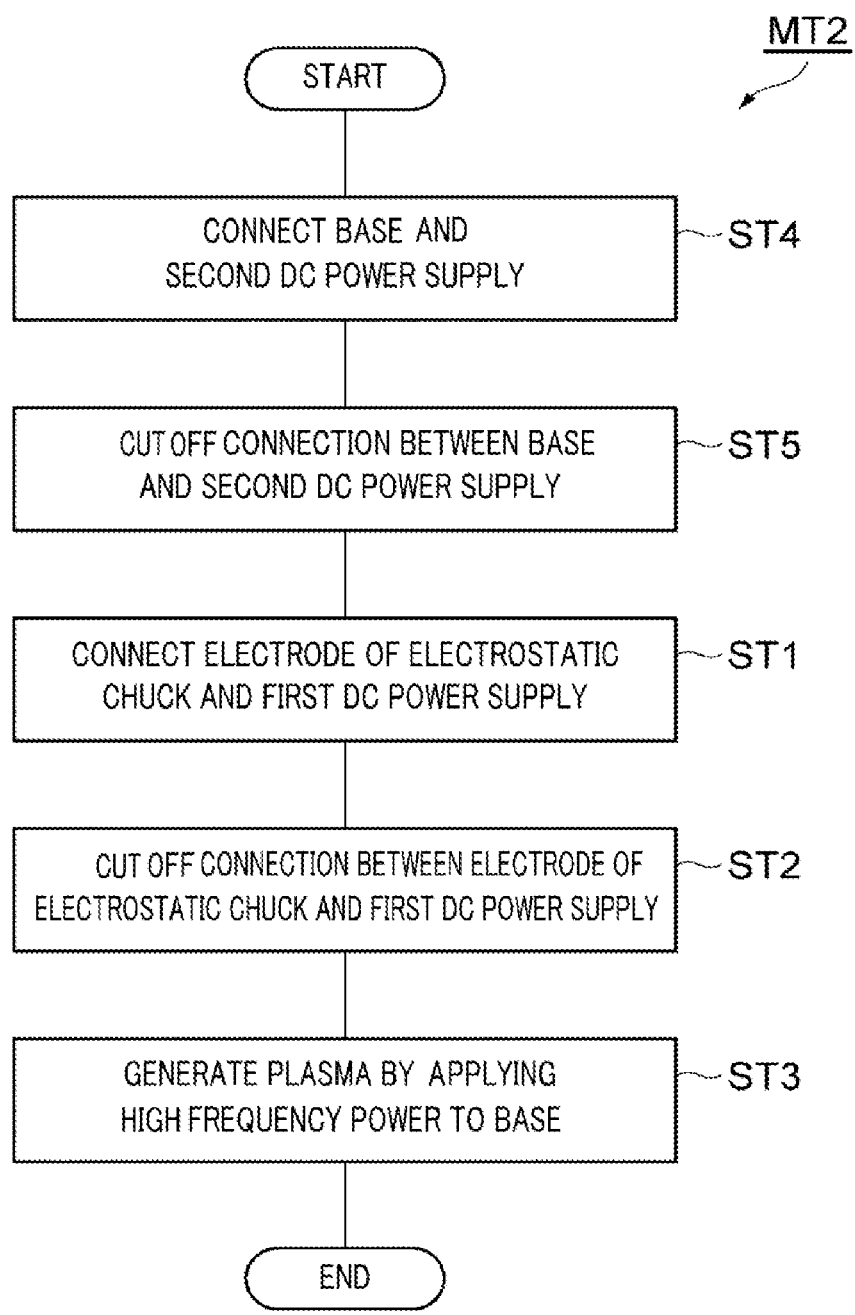

US 9,484,180 B2

PLASMA PROCESSING METHOD AND PLASMA PROCESSING APPARATUS

CROSS-REFERENCE TO RELATED APPLICATION

This application claims the benefit of Japanese Patent Application No. 2013-185326 filed on Sep. 6, 2013, the entire disclosures of which are incorporated herein by reference.

TECHNICAL FIELD

The embodiments described herein pertain generally to a plasma processing method and a plasma processing apparatus.

BACKGROUND

In the manufacture of electronic devices, there may be performed a plasma process in which a processing target object is processed by plasma generated in a processing chamber of a plasma processing apparatus. A general plasma processing apparatus includes a mounting table provided within a processing chamber, and the mounting table has a base and an electrostatic chuck provided on the base. The electrostatic chuck has an electrode to which a DC power supply is connected. Further, the base is connected to a high frequency power supply. In such a plasma processing apparatus, a resistance filter configured to protect the DC power supply from a high frequency power is provided between the DC power supply and the electrode of the electrostatic chuck.

In the plasma processing apparatus, an abnormal discharge may be generated between the processing target object and the base as a result of an increase of a potential difference between the processing target object and the base. To suppress the abnormal discharge, the potential difference between the processing target object and the base needs to be reduced. A plasma processing apparatus capable of reducing a potential difference between a processing target object and a base is described in, for example, Patent Document 1. The plasma processing apparatus depicted in Patent Document 1 applies a DC voltage to the base according to a surface potential of the processing target object by referring to table data indicating a relationship between a power of a high frequency power applied to the base and the surface potential of the processing target object.
Patent Document 1: International Publication No. 03/009363

In a plasma process using the plasma processing apparatus, however, a high frequency power applied to the base tends to be more increasing. If such a large high frequency power is applied to the base, a heat from the resistance filter may be increased to a non-negligible level.

Thus, it is required to protect the DC power supply from the high frequency power without the resistance filter.

SUMMARY

In one example embodiment, a plasma processing method is performed in a plasma processing apparatus. The plasma processing apparatus includes a processing chamber; a conductive base provided within the processing chamber; an electrostatic chuck, having an electrode, provided on the base; a high frequency power supply configured to apply a high frequency power to the base; a first DC power supply configured to apply a DC voltage to the electrostatic chuck; and a plasma generation unit configured to generate plasma of a processing gas within the processing chamber. Further, the plasma processing method includes connecting the first DC power supply to the electrode of the electrostatic chuck; cutting off connection between the first DC power supply and the electrode of the electrostatic chuck; and generating the plasma within the processing chamber by applying the high frequency power to the base from the high frequency power supply in a state that the connection between the first DC power supply and the electrode of the electrostatic chuck is cut off.

In the connecting of the first DC power supply to the electrode of the electrostatic chuck of this plasma processing method, the electrode of the electrostatic chuck and the first DC power supply are electrically connected, and electric charges are accumulated in the electrostatic chuck. As the electric charges are accumulated, a processing target object is attracted to and held on the electrostatic chuck. In the cutting off of the connection between the first DC power supply and the electrode of the electrostatic chuck, the electric connection between the electrode of the electrostatic chuck and the first DC power supply is cut off, and the electrostatic chuck becomes an electrically floating state. In the generating of the plasma, since the plasma is generated by applying the high frequency power to the base in a state that the connection between the first DC power supply and the electrode of the electrostatic chuck is cut off, it is possible to protect the first DC power supply from the high frequency power.

The plasma processing apparatus may further include a first movable power feeder connected to the first DC power supply. In the connecting of the first DC power supply to the electrode of the electrostatic chuck, the first movable power feeder may be connected to the electrode of the electrostatic chuck. Further, in the cutting off of the connection between the first DC power supply and the electrode of the electrostatic chuck, the first movable power feeder may be moved such that the connection between the first movable power feeder and the electrode of the electrostatic chuck is cut off. Moreover, the connection between the first DC power supply and the electrode of the electrostatic chuck may be cut off by a switch.

The plasma processing method may further include connecting, prior to the applying of the high frequency power, the base to the first DC power supply or a second DC power supply serving as a separate power supply configured to generate a DC voltage; and cutting off connection between the base and the second DC power supply. Further, the generating of the plasma may be performed in a state that the connection between the base and the second DC power supply is cut off. In the connecting of the second DC power supply to the base, the second DC power supply is electrically connected to the base, so that electric charges are accumulated in the base. Further, in the cutting off of the connection between the base and the second DC power supply, since the connection between the base and the second DC power supply is cut off, the base is turned into an electrically floating state. In the generating of the plasma, when the plasma is generated by applying the high frequency power to the base, a potential difference between the processing target object and the base is reduced due to the accumulated electric charges. As a result, it is possible to suppress an abnormal discharge between the processing target object and the base. In the generating of the plasma, when applying the high frequency power, the state in which the electric connection between the second DC power supply and the base is cut off is maintained, so that it is possible to protect the second DC power supply from the high frequency power.

The plasma processing apparatus may further include a second movable power feeder connected to the second DC power supply. In the connecting of the second DC power supply to the base, the second movable power feeder may be connected to the base. Further, in the cutting off of the connection between the base and the second DC power supply, the second movable power feeder may be moved such that the connection between the second movable power feeder and the base is cut off. Moreover, the connection between the second DC power supply and the base may be cut off by a switch.

In another example embodiment, the plasma processing apparatus includes a processing chamber; a conductive base provided within the processing chamber; an electrostatic chuck, having an electrode, provided on the base; a high frequency power supply configured to apply a high frequency power to the base; a first DC power supply configured to apply a DC voltage to the electrostatic chuck; a plasma generation unit configured to generate plasma of a processing gas within the processing chamber; a first unit configured to switch connection and disconnection between the first DC power supply and the electrode of the electrostatic chuck; and a controller configured to control the plasma generation unit, the high frequency power supply and the first unit. Further, the controller is configured to perform a first control of controlling the first unit such that the first DC power supply is connected to the electrode of the electrostatic chuck; a second control of controlling the first unit such that the connection between the first DC power supply and the electrode of the electrostatic chuck is cut off; and a third control of controlling the plasma generation unit and the high frequency power supply such that the plasma is generated within the processing chamber by applying the high frequency power to the base from the high frequency power supply in a state that the connection between the first DC power supply and the electrode of the electrostatic chuck is cut off.

In this plasma processing apparatus, under the control of the controller, there are performed the first control of controlling the first unit such that the first DC power supply is connected to the electrode of the electrostatic chuck; the second control of controlling the first unit such that the connection between the electrode of the electrostatic chuck and the first DC power supply is cut off; and the third control of controlling the plasma generation unit and the high frequency power supply to generate plasma within the processing chamber by supplying the high frequency power to the base from the high frequency power supply in the state that the connection between the first DC power supply and the electrode of the electrostatic chuck is cut off. Thus, according to the plasma processing apparatus, it is possible to perform the above-stated plasma processing method in accordance with the one example embodiment.

The first unit may include a first movable power feeder and a first device configured to move the first movable power feeder. Further, the controller may connect the first movable power feeder to the electrode of the electrostatic chuck by controlling the first device in the first control. Furthermore, the controller may move the first movable power feeder, by controlling the first device in the second control, such that the connection between the first movable power feeder and the electrode of the electrostatic chuck is cut off.

The plasma processing apparatus may further include a second unit configured to switch connection and disconnection between the base and the first DC power supply or a second DC power supply serving as a separate DC power supply from the first DC power supply. Further, prior to the third control, the controller may be configured to perform a fourth control of controlling the second unit such that the base is connected to the second DC power supply; and a fifth control of controlling the second unit such that the connection between the base and the second DC power supply is cut off. Furthermore, the third control may be performed in a state that the connection between the base and the second DC power supply is cut off.

The second unit may include a second movable power feeder connected to the second DC power supply; and a second device configured to move the second movable power feeder. Further, the controller may connect the second movable power feeder to the base by controlling the second device in the fourth control, and the controller may move the second movable power feeder, by controlling the second device in the fifth control, such that the connection between the second movable power feeder and the base is cut off.

In accordance with the various aspects and embodiments as stated above, it is possible to protect the DC power supply from the high frequency power without a resistance filter.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A and FIG. 2B are cross sectional views schematically depicting a wiring structure in a mounting table of the plasma processing apparatus in accordance with the first example embodiment;

FIG. 3 is a flowchart for describing a plasma processing method in accordance with the first example embodiment;

FIG. 5 is a flowchart for describing a plasma processing method in accordance with the second example embodiment.

DETAILED DESCRIPTION

Figure 1:
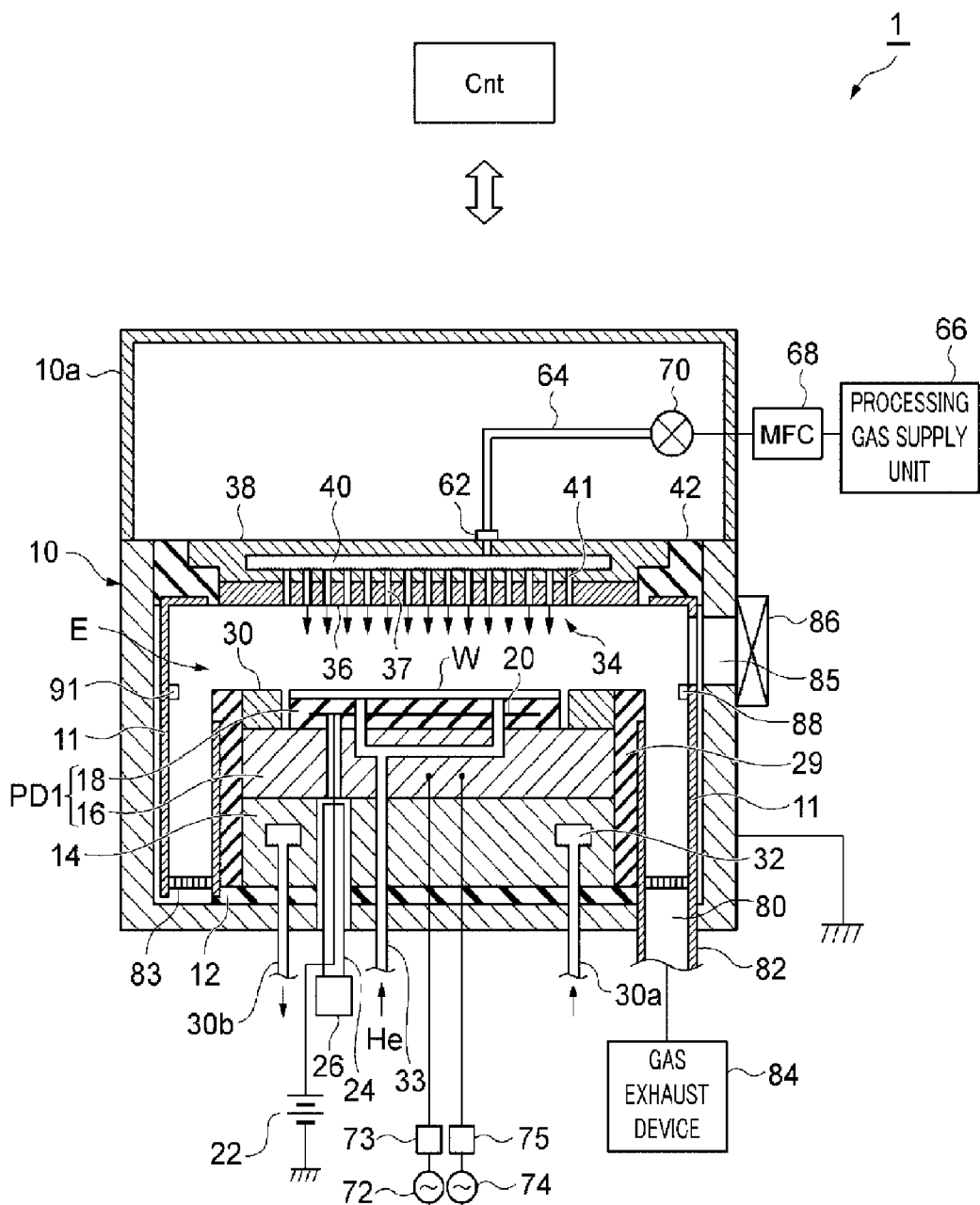
FIG. 1 is a diagram schematically depicting a plasma processing apparatus in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Example Embodiment

First, referring to FIG. 1, a schematic configuration of a plasma processing apparatus in accordance with a first example embodiment will be described. FIG. 1 is a diagram schematically depicting the plasma processing apparatus in accordance with the first example embodiment. The plasma processing apparatus 1 shown in FIG. 1 is configured as a capacitively coupled parallel plate type plasma processing apparatus. The plasma processing apparatus 1 includes a substantially cylindrical processing chamber 10 made of, but not limited to, aluminum having an anodically oxidized surface. The processing chamber 10 is frame-grounded.

A mounting table PD1 is provided within the processing chamber 10. The mounting table PD1 includes a base 16 and an electrostatic chuck 18. The base 16 is a conductive member and serves as a lower electrode. The base 16 is made of, by way of non-limiting example, aluminum. In the present example embodiment, an insulating plate 12 made of, but not limited to, ceramics is provided on a bottom of the processing chamber 10, and a cylindrical supporting table 14 is provided on the insulating plate 12. The base 16 is placed on the supporting table 14. Further, a cylindrical inner wall member 29 is provided on side surfaces of the supporting table 14 and the base 16. The inner wall member 29 is made of, but not limited to, quartz.

The electrostatic chuck 18 configured to attract and hold a wafer W by an electrostatic force is provided on a top surface of the base 16. The electrostatic chuck 18 has a structure in which an electrode 20 made of a conductive film is interposed between a pair of insulating layers or insulating sheets. A DC voltage from a first DC power supply 22 is applied to the electrode 20.

A focus ring (correction ring) 30 is provided on the top surface of the base 16 to surround the electrostatic chuck 18. The focus ring 30 has conductivity and is made of, but not limited to, silicon. The focus ring 30 is configured to improve uniformity of a plasma process on the wafer W.

A coolant path 32 is formed within the supporting table 14. A coolant is circulated between the coolant path 32 and a chiller unit through pipelines 30a and 30b. Further, the plasma processing apparatus 1 also includes a gas supply line 33. The gas supply line 33 is configured to supply a heat transfer gas, e.g., a He gas, from a heat transfer gas supply unit into a space between a top surface of the electrostatic chuck 18 and a rear surface of the wafer W.

An upper electrode 34 is provided above the base 16, which serves as the lower electrode, to face the base 16. The upper electrode 34 and the base 16 are arranged substantially in parallel to each other. A processing space E, in which a plasma process is performed on the wafer W, is formed between the upper electrode 34 and the base 16.

The upper electrode 34 is placed at a top portion of the processing chamber 10 by being held with an insulating shield member 42. The upper electrode 34 may include an electrode plate 36 and an electrode supporting member 38.

The electrode plate 36 constitutes a surface facing the base 16, and is provided with a multiple number of gas discharge holes 37. The electrode plate 36 may be made of a low-resistance conductor or semiconductor having low Joule's heat. Alternatively, the electrode plate 36 may be made of a silicon-containing material such as silicon or SiC in the aspect of enhancing resistance, as will be described later.

The electrode supporting member 38 is configured to support the electrode plate 36 in a detachable manner and may be made of a conductive material such as, but not limited to, aluminum. The electrode supporting member 38 may have a water-cooling structure. A gas diffusion space 40 is formed within the electrode supporting member 38. A multiple number of gas through holes 41 communicating with the gas discharge holes 37 are extended downward from the gas diffusion space 40. Further, the electrode supporting member 38 has a gas inlet opening 62 through which a processing gas is introduced into the gas diffusion space 40. A gas supply line 64 is connected to the gas inlet opening 62.

The gas supply line 64 is connected to a processing gas supply unit 66. The gas supply line 64 is equipped with a flow rate controller 68 such as a mass flow controller and an opening/closing valve 70 in sequence from the upstream side thereof. The processing gas supply unit 66 is configured to supply a processing gas for a plasma process. The processing gas from the processing gas supply unit 66 is introduced into the gas diffusion space 40 through the gas supply line 64, and then, is discharged into the processing space E through the gas through holes 41 and the gas discharge holes 37. That is, the upper electrode 34 serves as a shower head configured to supply the processing gas.

Further, the plasma processing apparatus 1 may further include a grounding conductor 10a. The grounding conductor 10a is of a substantially cylindrical shape and is provided to be extended upward from a sidewall of the processing chamber 10 to a position higher than the upper electrode 34.

Further, a deposition shield 11 is detachably attached along an inner wall of the processing chamber 10. A deposition shield 11 is also provided at an outer periphery of the inner wall member 29. The deposition shield 11 is configured to suppress an etching by-product (deposit) from adhering to the processing chamber 10. The deposition shield 11 may be made of, but not limited to, an aluminum member coated with ceramics such as $Y_2O_3$.

A gas exhaust plate 83 is provided between the inner wall member 29 and the inner wall of the processing chamber 10 at a bottom portion of the processing chamber 10. The gas exhaust plate 83 may be made of, but not limited to, an aluminum member coated with ceramics such as $Y_2O_3$. A gas exhaust opening 80 is formed under the gas exhaust plate 83 at the processing chamber 10, and a gas exhaust device 84 is connected to the gas exhaust opening 80 via a gas exhaust line 82. The gas exhaust device 84 includes a vacuum pump such as a turbo molecular pump and is capable of depressurizing the inside of the processing chamber 10 to a desired vacuum degree. Further, a loading/unloading opening 85 for the wafer W is formed in the sidewall of the processing chamber 10, and the loading/unloading opening 85 is opened or closed by a gate valve 86.

A conductive member (GND block) 88 is provided at the inner wall of the processing chamber 10. The conductive member 88 is provided at the inner wall of the processing chamber 10 to be located at a position substantially same level with the wafer W in the height direction. The conductive member 88 is DC-connected to the ground and is configured to suppress an abnormal discharge. Here, the position of the conductive member 88 is not limited to the example shown in FIG. 1 as long as the conductive member 88 is located within a plasma generation region. By way of example, the conductive member 88 may be provided at the side of the base 16, e.g., in the vicinity of the base 16, or may be provided near the upper electrode 34, e.g., in a ring shape outside the upper electrode 34.

Further, the plasma processing apparatus 1 further includes a first high frequency power supply 72 and a second high frequency power supply 74. The first high frequency power supply 72 is configured to generate a first RF (Radio Frequency) power for plasma generation having a frequency ranging from, e.g., 27 MHz to 100 MHz (e.g., 40 MHz). The first high frequency power supply 72 is connected to the base 16, which serves as the lower electrode, via a matching unit 73. The matching unit 73 is configured to match an output impedance on the first high frequency power supply 72 and an input impedance on a load side (on the side of the base 16 as the lower electrode).

The second high frequency power supply 74 is configured to generate a second RF power for ion attraction into the wafer W, i.e., an RF bias power. Specifically, the second high frequency power supply 74 generates a RF power of a frequency ranging from, e.g., 400 kHz to 13.56 MHz (e.g., 3 MHz). The second high frequency power supply 74 is connected to the base 16, which serves as the lower electrode, via a matching unit 75. The matching unit 75 is configured to match an output impedance on the second high frequency power supply 74 and an input impedance on the load side (on the side of the base 16 as the lower electrode). Further, the first high frequency power supply 72, the opening/closing valve 70 and the processing gas supply unit 66 form a plasma generation unit in the example embodiment.

Further, the plasma processing apparatus 1 may further include a controller Cnt. The controller Cnt is a computer including a processor, a storage unit, an input device, a display device, etc. The controller Cnt is configured to control respective components of the plasma processing apparatus 1 such as a power supply system, a gas supply system, a driving system, and so forth. The input device of the controller Cnt allows an operator to input commands to manage the plasma processing apparatus 1, and the display device of the controller Cnt is configured to visually display an operational status of the plasma processing apparatus 1. Further, the storage unit of the controller Cnt is configured to store therein control programs for controlling various processes performed in the plasma processing apparatus 1 under the control of the processor, or programs for implementing the various processes in the respective components of the plasma processing apparatus 1 according to processing conditions, i.e., processing recipes.

Now, referring to FIG. 2A and FIG. 2B, a wiring structure in the mounting table of the plasma processing apparatus in accordance with the first example embodiment will be elaborated. FIG. 2A and FIG. 2B are cross sectional views schematically illustrating a wiring structure in the mounting table of the plasma processing apparatus in the first example embodiment. In FIG. 2A and FIG. 2B, enlarged cross sectional views of a part of the mounting table are provided. As depicted in FIG. 2A and FIG. 2B, the plasma processing apparatus 1 has a wiring structure in which electric connection and disconnection between the first DC power supply 22 and the electrode 20 of the electrostatic chuck 18 can be switched. Below, an example of such a wiring structure will be described in detail.

The base 16 is provided with a through hole 16a, which is vertically formed through the base 16, and a conducting wire 50 is extended in the through hole 16a. A metallic terminal member 52 is connected to one end, i.e., an upper end of the conducting wire 50, and a metallic terminal member 54 is connected to the other end, i.e., a lower end of the conducting wire 50. The terminal member 52 is bonded to a terminal 20t of the electrode 20 of the electrostatic chuck 18 by using, for example, soldering, solder joint or conductive adhesive.

Further, a through hole 14a is vertically formed through the supporting table 14 to be continuously communicated with the through hole 16a. The plasma processing apparatus 1 further includes a first movable power feeder 24 configured to be movable in the vertical direction within the through hole 14a. The first movable power feeder 24 has a terminal 56 at a leading end thereof and is electrically connected to the first DC power supply 22. Further, the first movable power feeder 24 is provided at a driving device 26. The driving device 26 is configured to generate a driving force through which the first movable power feeder 24 is moved in the vertical direction. The driving device 26 forms a first device in the example embodiment, and the driving device 26 and the first movable power feeder 24 form a first unit in the example embodiment.

The terminal member 54 provided at the other end of the wiring conductor 50 is located in the vicinity of a boundary between the through hole 16a and the through hole 14a. The terminal member 54 is supported at the base 16 or the supporting table 14 while insulated from the base 16 and the supporting table 14.

As depicted in FIG. 2A, if the terminal 56 provided at the leading end of the first movable power feeder 24 is brought into contact with the terminal member 54 by moving up the first movable power feeder 24 through the driving device 26, the first DC power supply 22 and the electrode 20 of the electrostatic chuck 18 can be electrically connected to each other. Further, as shown in FIG. 2B, if the terminal 56 of the first movable power feeder 24 is disconnected from the terminal member 54 by moving down the first movable power feeder 24 through the driving device 26, the connection between the first DC power supply 22 and the electrode 20 of the electrostatic chuck 18 can be cut off.

The aforementioned controller Cnt may perform a first control, a second control and a third control in sequence in the plasma processing apparatus 1 having the above-described wiring structure. In the first control, the control Cnt is configured to control the driving device 26 such that the first DC power supply 22 is electrically connected to the electrode 20 of the electrostatic chuck 18. To elaborate, the controller Cnt controls the driving device 26 to move up the first movable power feeder 24. Accordingly, as depicted in FIG. 2A, the terminal 56 of the first movable power feeder 24 is brought into contact with the terminal member 54. As a result, the electrode 20 of the electrostatic chuck 18 and the first DC power supply 22 are electrically connected, and a DC voltage is applied to the electrode 20 of the electrostatic chuck 18. As a consequence of this first control, electric charges are accumulated in the electrostatic chuck 18.

In the subsequent second control, the controller Cnt is configured to control the driving device 26 such that the electric connection between the electrode 20 of the electrostatic chuck 18 and the first DC power supply 22 is cut off. To elaborate, the controller Cnt controls the driving device 26 to move down the first movable power feeder 24. Accordingly, the terminal 56 of the first movable power feeder 24 is disconnected from the terminal member 54. As a result, the electric connection between the electrode 20 of the electrostatic chuck 18 and the first DC power supply 22 is cut off, and the electrostatic chuck 18 becomes an electrically floating state. In this state, the wafer W mounted on the electrostatic chuck 18 is maintained in a state that the wafer W is attracted to and held on the electrostatic chuck 18 by a Coulomb force generated based on the electric charges accumulated in the electrostatic chuck 18.

In the following third control, in the state that the electric connection between the electrode 20 of the electrostatic chuck 18 and the first DC power supply 22 is cut off, the controller Cnt is configured to control the flow rate controller 68, the opening/closing valve 70, the processing gas supply unit 66, the first high frequency power supply 72 and the second high frequency power supply 74 to generate plasma of a processing gas within the processing chamber 10 and apply a high frequency power to the base 16. To elaborate, the controller Cnt controls the flow rate controller 68, the opening/closing valve 70 and the processing gas supply unit 66 to supply the processing gas into the processing chamber 10, and also controls the first high frequency power supply 72 to apply the high frequency power to the base 16 from the first high frequency power supply 72. Accordingly, the plasma of the processing gas is generated within the processing chamber 10. Further, in the third control, the controller Cnt also controls the second high frequency power supply 74 to apply a high frequency power to the base 16 from the second high frequency power supply 74. Accordingly, electrons in the plasma are attracted toward the wafer W. When performing the third control, since the first DC power supply 22 and the electrode 20 of the electrostatic chuck 18 is electrically disconnected from each other, it is possible to suppress the high frequency powers from being introduced into the first DC power supply 22. That is, it is possible to protect the first DC power supply 22 from the high frequency powers without using the resistance filter.

Now, referring to FIG. 3, a plasma processing method performed by the plasma processing apparatus 1 in accordance with the example embodiment will be discussed. FIG. 3 is a flowchart for describing the plasma processing method according to the example embodiment. The plasma processing method MT1 depicted in FIG. 3 includes block ST1, block ST2 and block ST3. Processing may begin at block ST1.

At block ST1 (Connect Electrode of Electrostatic Chuck and First DC Power Supply), the electrode 20 of the electrostatic chuck 18 and the first DC power supply 22 are electrically connected. When performing the process of block ST1 in the plasma processing apparatus 1, by bringing the terminal 56 of the first movable power feeder 24 into contact with the terminal member 54, the electrode 20 of the electrostatic chuck 18 and the first DC power supply 22 are electrically connected to each other, as shown in FIG. 2A. Processing may proceed from block ST1 to block ST2.

At block ST2 (Cut off Connection between Electrode of Electrostatic Chuck and First DC Power Supply), the electric connection between the electrode 20 of the electrostatic chuck 18 and the first DC power supply 22 is cut off. When performing the process of block ST2 in the plasma processing apparatus 1, by disconnecting the terminal 56 of the first movable power feeder 24 from the terminal member 54, the electric connection between the electrode 20 of the electrostatic chuck 18 and the first DC power supply 22 is cut off, as shown in FIG. 2B. Processing may proceed from block ST2 to block ST3.

At block ST3 (Generate Plasma by Applying High frequency Power to Base), in the state that the electric connection between the electrode 20 of the electrostatic chuck 18 and the first DC power supply 22 is cut off, a high frequency power is applied to the base 16 from the high frequency power supply 72, so that plasma is generated within the processing chamber 10.

According to this plasma processing method MT1, at block ST1, the electrode 20 of the electrostatic chuck 18 and the first DC power supply 22 are electrically connected, and electric charges are accumulated in the electrostatic chuck 18. Through this process of block ST1, the wafer W is attracted to and held on the electrostatic chuck 18. At block ST2 that follows, the electric connection between the electrode 20 of the electrostatic chuck 18 and the first DC power supply 22 is cut off, and the electrode 20 of the electrostatic chuck 18 is turned into the electrically floating state. In the method MT1, although the electric connection between the electrode 20 of the electrostatic chuck 18 and the first DC power supply 22 is cut off after block ST2, the wafer W is still attracted to and held by the electrostatic chuck by the electric charges accumulated in the electrostatic chuck 18 at block ST1. Then, in the subsequent process of block ST3, in the state that the connection between the electrode 20 of the electrostatic chuck 18 and the first DC power supply 22 is cut off, the high frequency power is applied to the base 16, so that the plasma is generated. In the method MT1, since the electric connection between the first DC power supply 22 and the electrode 20 of the electrostatic chuck 18 has been cut off when performing the process of block ST3, i.e., while the high frequency power is being applied to the base 16, it is possible to protect the DC power supply 22 from the high frequency power.

Second Example Embodiment

Figure 4:
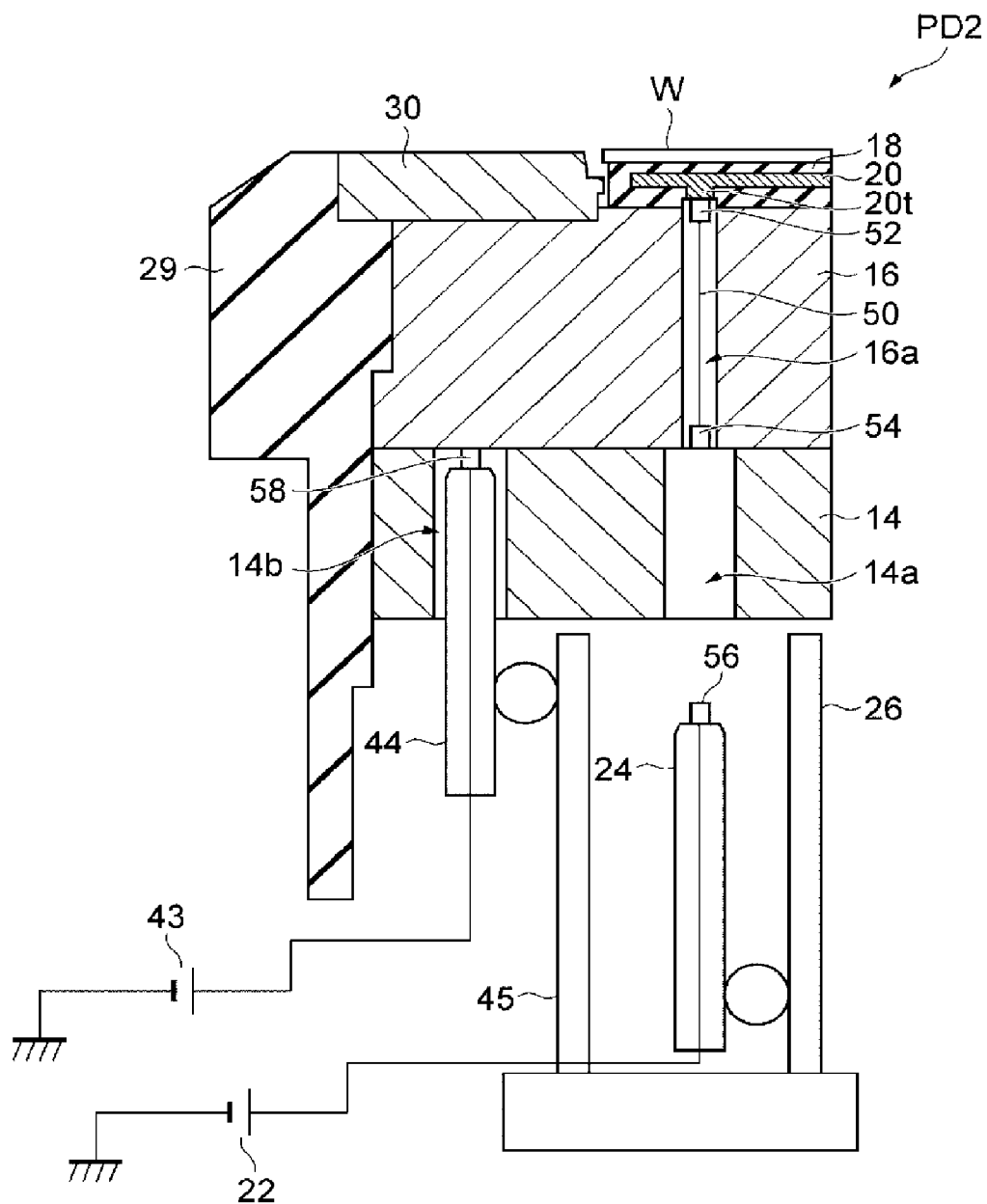
FIG. 4 is a cross sectional view schematically depicting a wiring structure in a mounting table of a plasma processing apparatus in accordance with a second example embodiment.

Now, referring to FIG. 4, a plasma processing apparatus in accordance with a second example embodiment will be described. The following description will be focused on distinctive parts of the second example embodiment from the first example embodiment. FIG. 4 is a cross sectional view schematically illustrating a wiring structure in a mounting table of the plasma processing apparatus of the second example embodiment. In FIG. 4, an enlarged cross sectional view of a part of the mounting table is depicted. The plasma processing apparatus of the second example embodiment has a configuration substantially identical to that of the plasma processing apparatus 1 of the first example embodiment excepting that a second DC power supply 43 configured to generate a DC voltage is provided as a DC power supply in addition to the first DC power supply 22, and a second movable power feeder 44 and a driving device 45 are provided in addition to the first movable power feeder 24 and the driving device 26. Further, the driving device 45 forms a second device in the example embodiment, and the driving device 45 and the second movable power feeder 44 form a second unit of the example embodiment.

In the wiring structure of the plasma processing apparatus in accordance with the second example embodiment, it is possible to switch electric connection and disconnection between the second DC power supply 43 and the base 16 in addition to the switching electric connection and disconnection between the first DC power supply 22 and the electrode 20 of an electrostatic chuck 18. To elaborate, as depicted in FIG. 4, a vertically extended through hole 14*b* is formed through a supporting table 14 of a mounting table PD2 in addition to the through hole 14*a*. In the second example embodiment, the plasma processing apparatus further includes the second movable power feeder 44 configured to be movable in the vertical direction within the through hole 14*b*.

The second movable power feeder 44 has a terminal 58 at a leading end thereof and is electrically connected to the second DC power supply 43. Further, the second movable power feeder 44 is provided at the driving device 45. The driving device 45 is configured to generate a driving force for moving the second movable power feeder 44 in the vertical direction.

A controller Cnt of the plasma processing apparatus in the second example embodiment is capable of implementing a fourth control and a fifth control in addition to the first control to the third control. In the present example embodiment, the controller Cnt may perform the fourth control and the fifth control prior to the third control. In the fourth control, the controller Cnt is configured to control the driving device 45 such that the second DC power supply 43 is electrically connected to the base 16. To elaborate, the controller Cnt controls the driving device 45 to move up the second movable power feeder 44. Accordingly, the terminal 58 of the second movable power feeder 44 is brought into contact with a bottom surface of the base 16. As a result, the second DC power supply 43 and the base 16 are electrically connected, and electric charges are accumulated in the base 16.

In the subsequent fifth control, the controller Cnt is configured to control the driving device 45 such that the electric connection between the base 16 and the second DC power supply 43 is cut off. To be specific, the controller Cnt controls the driving device 45 to move down the second movable power feeder 44. Accordingly, the terminal 58 of the second movable power feeder 44 is disconnected from the bottom surface of the base 16. As a result, the electric connection between the second DC power supply 43 and the base 16 is cut off, and the base 16 is turned into an electrically floating state. Thereafter, the controller Cnt performs the third control. In the plasma processing apparatus of the present example embodiment, when plasma is being generated by performing the third control, a potential difference between the wafer W and the base 16 is reduced by the electric charges accumulated through the fourth control. As a result, it is possible to suppress an abnormal discharge between the wafer W and the base 16. Further, when performing the third control, since the electric connection between the second DC power supply 43 and the base 16 is cut off, it is possible to protect the second DC power supply 43 from the high frequency power applied to the base 16.

Now, referring to FIG. 5, a plasma processing method that can be implemented by the plasma processing apparatus in accordance with the second example embodiment will be described. FIG. 5 is a flowchart for describing the plasma processing method in accordance with the second example embodiment. The plasma processing method MT2 depicted in FIG. 5 includes block ST4 and block ST5 in addition to block ST1, block ST2 and block ST3.

At block ST4 (Connect Base and Second DC Power Supply), the second DC power supply 43 and the base 16 are electrically connected. When performing the process of block ST4 in the plasma processing apparatus of the second example embodiment, by bringing the terminal 58 of the second movable power feeder 44 into contact with the bottom surface of the base 16, the second DC power supply 43 is electrically connected to the base 16. Through this process of block ST4, electric charges are accumulated in the base 16.

At block ST5 (Cut off Connection between Base and Second DC Power Supply), the electric connection between the second DC power supply 43 and the base 16 is cut off. When performing the process of block ST5 in the plasma processing apparatus of the second example embodiment, as the terminal 58 of the second movable power feeder 44 is disconnected from the bottom surface of the base 16, the electric connection between the second DC power supply 43 and the base 16 is cut off. Accordingly, the base 16 is turned into an electrically floating state, and the electric charges accumulated in the base 16 are maintained.

Subsequently, in the method MT2, the above-described processes of blocks ST1 to ST3 are performed. In this method MT2, while the plasma is generated at block ST3, a potential difference between the wafer W and the base 16 is reduced due to the electric charges accumulated in the base 16 at block ST4. As a result, an abnormal discharge between the wafer W and the base 16 can be suppressed. Furthermore, when performing the process of block ST3, since the electric connection between the second DC power supply 43 and the base 16 is cut off, it is possible to protect the second DC power supply 43 from the high frequency power applied to the base 16.

So far, the various example embodiments have been described. Here, however, it should be noted that the above-described example embodiments are not limited thereto, and various modifications may be made.

By way of example, in the above-described example embodiments, resistance filters configured to protect the first DC power supply 22 and the second DC power supply 43 from the high frequency power, respectively, are not provided. However, a resistance filter may be provided on an electric path between the first DC power supply 22 and the electrode of the electrostatic chuck 18. Further, it may be also possible to provide a resistance filter on an electric path between the second DC power supply 43 and the base 16. In these modification examples, when performing the process of block ST3 (when performing the third control), i.e., when generating the plasma by applying the high frequency power to the base 16, it is possible to electrically connect the first DC power supply 22 and the electrode 20 of the electrostatic chuck 18 and, also, to electrically connect the second DC power supply 43 and the base 16.

Further, in the method MT2, the processes of blocks ST4 and ST5 are performed prior to blocks ST1 and ST2. However, the processes of blocks ST4 and ST5 may be performed after blocks ST1 and ST2 or may be performed partially concurrently with blocks ST1 and ST2. Further, it may be also possible to perform the process of block ST3 after blocks ST4 and ST5 without performing the processes of blocks ST1 and ST2.

Furthermore, the connection and disconnection between the first DC power supply 22 and the electrode 20 of the electrostatic chuck 18 may be switched by a switch. Likewise, the connection and disconnection between the second DC power supply 43 and the base 16 may also be switched by a switch.

In addition, in the second example embodiment, the first DC power supply 22 and the second DC power supply 43 are described as separate DC power supplies. However, it may be possible to use a single DC power supply for both of the first DC power supply and the second DC power supply.

Moreover, the plasma processing apparatus may not be limited to the aforementioned capacitively coupled plasma processing apparatus, but may be an inductively coupled plasma processing apparatus or a plasma processing apparatus using a microwave as a plasma source as long as the apparatus has a configuration in which a high frequency power is applied to a conductor within a mounting table configured to mount thereon a processing target object.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing method performed in a plasma processing apparatus,
    wherein the plasma processing apparatus comprises:
    a processing chamber;
    a conductive base provided within the processing chamber;
    an electrostatic chuck, having an electrode, provided on the base;
    a high frequency power supply configured to apply a high frequency power to the base;
    a first DC power supply configured to apply a DC voltage to the electrostatic chuck; and
    a plasma generation unit configured to generate plasma of a processing gas within the processing chamber, and
    wherein the plasma processing method comprises:
    connecting the first DC power supply to the electrode of the electrostatic chuck;
    cutting off connection between the first DC power supply and the electrode of the electrostatic chuck; and
    generating the plasma within the processing chamber by applying the high frequency power to the base from the high frequency power supply in a state that the connection between the first DC power supply and the electrode of the electrostatic chuck is cut off.

2. The plasma processing method of claim 1,
    wherein the plasma processing apparatus further includes a first movable power feeder connected to the first DC power supply,
    in the connecting of the first DC power supply to the electrode of the electrostatic chuck, the first movable power feeder is connected to the electrode of the electrostatic chuck, and
    in the cutting off of the connection between the first DC power supply and the electrode of the electrostatic chuck, the first movable power feeder is moved such that the connection between the first movable power feeder and the electrode of the electrostatic chuck is cut off.

3. The plasma processing method of claim 1, further comprising:
    connecting, prior to the applying of the high frequency power, the base to the first DC power supply or a second DC power supply serving as a separate power supply configured to generate a DC voltage; and
    cutting off connection between the base and the second DC power supply,
    wherein the generating of the plasma is performed in a state that the connection between the base and the second DC power supply is cut off.

4. The plasma processing method of claim 3,
    wherein the plasma processing apparatus further includes a second movable power feeder connected to the second DC power supply,
    in the connecting of the second DC power supply to the base, the second movable power feeder is connected to the base, and
    in the cutting off of the connection between the base and the second DC power supply, the second movable power feeder is moved such that the connection between the second movable power feeder and the base is cut off.

5. The plasma processing apparatus, comprising:
    a processing chamber;
    a conductive base provided within the processing chamber;
    an electrostatic chuck, having an electrode, provided on the base;
    a high frequency power supply configured to apply a high frequency power to the base;
    a first DC power supply configured to apply a DC voltage to the electrostatic chuck;
    a plasma generation unit configured to generate plasma of a processing gas within the processing chamber;
    a first unit configured to switch connection and disconnection between the first DC power supply and the electrode of the electrostatic chuck; and
    a controller configured to control the plasma generation unit, the high frequency power supply and the first unit,
    wherein the controller is configured to perform:
    a first control of controlling the first unit such that the first DC power supply is connected to the electrode of the electrostatic chuck;
    a second control of controlling the first unit such that the connection between the first DC power supply and the electrode of the electrostatic chuck is cut off; and
    a third control of controlling the plasma generation unit and the high frequency power supply such that the plasma is generated within the processing chamber by applying the high frequency power to the base from the high frequency power supply in a state that the connection between the first DC power supply and the electrode of the electrostatic chuck is cut off.

6. The plasma processing apparatus of claim 5,
    wherein the first unit includes a first movable power feeder and a first device configured to move the first movable power feeder,
    the controller connects the first movable power feeder to the electrode of the electrostatic chuck by controlling the first device in the first control, and
    the controller moves the first movable power feeder, by controlling the first device in the second control, such that the connection between the first movable power feeder and the electrode of the electrostatic chuck is cut off.

7. The plasma processing apparatus of claim 5, further comprising:
    a second unit configured to switch connection and disconnection between the base and the first DC power supply or a second DC power supply serving as a separate DC power supply from the first DC power supply,
    wherein, prior to the third control, the controller is configured to perform a fourth control of controlling the second unit such that the base is connected to the second DC power supply; and a fifth control of controlling the second unit such that the connection between the base and the second DC power supply is cut off, and the third control is performed in a state that the connection between the base and the second DC power supply is cut off.

8. The plasma processing apparatus of claim 7, wherein the second unit includes a second movable power feeder connected to the second DC power supply; and a second device configured to move the second movable power feeder, the controller connects the second movable power feeder to the base by controlling the second device in the fourth control, and the controller moves the second movable power feeder, by controlling the second device in the fifth control, such that the connection between the second movable power feeder and the base is cut off.

\* \* \* \* \*